USA009664808B2

United States Patent
Nguyen et al.

(10) Patent No.: US 9,664,808 B2
(45) Date of Patent: May 30, 2017

(54) WALL SCANNER

(75) Inventors: Evans H. Nguyen, Renton, WA (US); Jason R. Crowe, Milwaukee, WI (US); Scott D. Bublitz, Hartland, WI (US); Mike N. Jones, Lake Forest Park, WA (US); Wai Nang Tse, Tsuen Wan (HK); Pak Fai Siu, Quarry Bay (HK); Man Kit Ho, Kowloon (HK)

(73) Assignee: MILWAUKEE ELECTRIC TOOL CORPORATION, Brookfield, WI (US)

( * ) Notice: Subject to any disclaimer, the term of this patent is extended or adjusted under 35 U.S.C. 154(b) by 1983 days.

(21) Appl. No.: 12/554,684

(22) Filed: Sep. 4, 2009

(65) Prior Publication Data

US 2010/0225299 A1 Sep. 9, 2010

Related U.S. Application Data

(63) Continuation-in-part of application No. 12/399,835, filed on Mar. 6, 2009.

(51) Int. Cl.
*G01R 19/00* (2006.01)
*G01V 3/10* (2006.01)
(Continued)

(52) U.S. Cl.
CPC ................ *G01V 3/10* (2013.01); *G01V 3/15* (2013.01); *H01M 2/105* (2013.01)

(58) Field of Classification Search
USPC .......................................... 324/67, 662, 663
See application file for complete search history.

(56) References Cited

U.S. PATENT DOCUMENTS 3,845,384 A  10/1974 Stoutenberg et al.
4,464,622 A  8/1984 Franklin
(Continued)

FOREIGN PATENT DOCUMENTS

WO    20081011517    1/2008

OTHER PUBLICATIONS

Bosch—The Wallscanner D-tect 100—The universal detection device, available on Nov. 17, 2004 at http://www.bosch.com.ph/content/language1/html/1769.htm.*
(Continued)

*Primary Examiner* — Daniel Miller
(74) *Attorney, Agent, or Firm* — Michael Best & Friedrich LLP

(57) ABSTRACT

Embodiments of the invention relate to a wall scanner that includes a housing, a plurality of sensors, a display, and a control section. The housing includes a handle portion and a body portion. The handle portion is adapted to receive a removable and rechargeable battery pack such as a high-voltage lithium-ion ("Li-Ion") battery pack. The body portion of the housing encloses the plurality of sensing devices, such as, for example, capacitive plate sensors for sensing the presence of a stud behind a surface, a D-coil sensor for identifying the presence of metal behind the surface, and a non-contact voltage sensor for detecting the presence of live wires carrying AC currents. The display is configured to display, among other things, the location of an object behind the surface in real-time, the depth of an object behind the surface, and whether an object behind the surface is ferrous or non-ferrous. The control section includes a plurality of actuation devices for controlling the functions and operations of the wall scanner, such as the scanning mode.

20 Claims, 16 Drawing Sheets

(51) Int. Cl.
*G01V 3/15* (2006.01)
*H01M 2/10* (2006.01)

(56) References Cited

U.S. PATENT DOCUMENTS

| | | | |
|---|---|---|---|
| 4,612,538 | A | 9/1986 | Karcher, Jr. |
| 4,853,617 | A | 8/1989 | Douglas et al. |
| 4,859,931 | A | 8/1989 | Yamashita et al. |
| 4,992,741 | A | 2/1991 | Douglas et al. |
| 4,998,058 | A | 3/1991 | Tofte et al. |
| 5,148,108 | A | 9/1992 | Dufour |
| 5,296,806 | A | 3/1994 | Hurl, Jr. |
| 5,352,974 | A | 10/1994 | Heger |
| 5,457,394 | A | 10/1995 | McEwan |
| 5,512,834 | A | 4/1996 | McEwan |
| 5,619,128 | A | 4/1997 | Heger |
| 5,762,029 | A * | 6/1998 | DuBois ............... A01K 27/004 119/796 |
| 5,812,057 | A | 9/1998 | Hepworth et al. |
| 5,877,618 | A | 3/1999 | Luebke et al. |
| 5,917,314 | A | 6/1999 | Heger et al. |
| 6,023,159 | A | 2/2000 | Heger |
| 6,198,271 | B1 | 3/2001 | Heger et al. |
| 6,211,662 | B1 | 4/2001 | Bijawat et al. |
| 6,215,293 | B1 | 4/2001 | Yim |
| 6,249,113 | B1 | 6/2001 | Krantz et al. |
| 6,259,241 | B1 | 7/2001 | Krantz |
| 6,301,997 | B1 | 10/2001 | Welte |
| 6,842,993 | B1 | 1/2005 | DiMauro |
| 6,844,713 | B2 | 1/2005 | Steber et al. |
| 6,894,508 | B2 | 5/2005 | Sanoner et al. |
| 6,926,473 | B2 | 8/2005 | Luebke |
| 6,978,503 | B2 | 12/2005 | Del Cogliano |
| 6,989,662 | B2 | 1/2006 | Heger et al. |
| 7,013,570 | B2 | 3/2006 | Levine et al. |
| 7,038,446 | B1 | 5/2006 | Keely |
| 7,059,057 | B2 | 6/2006 | Raskin et al. |
| 7,116,091 | B2 | 10/2006 | Miller |
| 7,125,145 | B2 | 10/2006 | Gardiner et al. |
| 7,134,217 | B2 | 11/2006 | Melittas |
| 7,147,162 | B2 | 12/2006 | Fitch et al. |
| 7,148,703 | B2 | 12/2006 | Miller |
| 7,170,076 | B2 | 1/2007 | Butler et al. |
| 7,178,250 | B2 | 2/2007 | Nash et al. |
| 7,181,855 | B2 | 2/2007 | Krantz et al. |
| 7,193,405 | B2 | 3/2007 | Murray |
| 7,212,014 | B2 | 5/2007 | Krantz |
| 7,222,437 | B2 | 5/2007 | Spanski et al. |
| 7,256,587 | B2 | 8/2007 | Sanoner et al. |
| 7,278,223 | B1 | 10/2007 | Dever et al. |
| 7,287,336 | B1 | 10/2007 | Goodrich |
| 7,316,073 | B2 | 1/2008 | Murray |
| 7,357,526 | B2 | 4/2008 | Zeiler |
| 7,358,746 | B2 | 4/2008 | Clauss et al. |
| 7,447,565 | B2 | 11/2008 | Cerwin |
| 7,504,817 | B2 | 3/2009 | Sanoner et al. |
| 7,602,175 | B2 | 10/2009 | Mednikov et al. |
| 7,633,282 | B2 | 12/2009 | Radle et al. |
| 2001/0007420 | A1 | 7/2001 | Bijawat et al. |
| 2003/0218469 | A1 | 11/2003 | Brazell et al. |
| 2005/0097765 | A1 | 5/2005 | Sorensen et al. |
| 2005/0247460 | A1 | 11/2005 | Luebke |
| 2006/0002233 | A1 | 1/2006 | Malard |
| 2006/0076385 | A1 | 4/2006 | Etter et al. |
| 2006/0091858 | A1 * | 5/2006 | Johnson et al. ............... 320/128 |
| 2006/0113985 | A1 | 6/2006 | Gist et al. |
| 2006/0148519 | A1 | 7/2006 | Simpson et al. |
| 2006/0196059 | A1 | 9/2006 | Berto |
| 2007/0079445 | A1 | 4/2007 | Siebeck |
| 2007/0200547 | A1 | 8/2007 | Chen |
| 2008/0186010 | A1 | 8/2008 | Skultety-Betz et al. |
| 2008/0196910 | A1 | 8/2008 | Radle et al. |
| 2008/0235954 | A1 | 10/2008 | Radle |
| 2008/0272761 | A1 | 11/2008 | Sanoner et al. |

OTHER PUBLICATIONS

Wallscanner D-tect 100, undated, available at http://www.surveyors-equipment.com/content/equipment/D-Tect100MANUALRICS.pdf.*

Chicago Electric Power Tools, 18 Volt Cordless Chainsaw, 2000, available at http://images.harborfreight.com/manuals/44000-44999/44493.PDF.*

Power Tools UK, D-tect 100 Bosch Wall Scanner Bosch D-tect 100, available at least as early as Apr. 21, 2009.

Hilti, PS 200 Ferroscan, Hilti USA, available online at: <http://www.us.hilti.com/holus/page/module/product/prca_rangedetail.jsf?lang=en&nodeld=-151065>, available at least as early as Apr. 21, 2009.

Hilti, PX 10 Transpointer, Hilti USA, available online at: <http://www.us.hilti.com/holus/page/module/product/prca_rangedetail.jsf?lang=en&nodeld=-72691>, available at least as early as Apr. 21, 2009.

Greenlee, Testing & Measurement, Catalog, available at least as early as Apr. 21, 2009.

* cited by examiner

WALL SCANNER

RELATED APPLICATIONS

This application is a continuation-in-part of prior filed co-pending U.S. patent application Ser. No. 12/399,835, filed Mar. 6, 2009, the entire contents of which are hereby incorporated by reference.

BACKGROUND

Embodiments of the invention relate to wall sensors. Wall sensors include the capability of detecting, for example, wooden or metal studs hidden behind a surface. In some instances, wall sensors include one or more plate sensors or high frequency transmitters for determining whether an object is hidden behind a surface. Wall sensors also include an indicating device or multiple indicating devices for alerting a user to the presence of an object that is hidden behind a surface. Indicating devices can include visual indicators such as light emitting diodes ("LEDs"), audible indicators such as a small speaker, or a combination thereof.

SUMMARY

Embodiments of the invention include a wall sensor or wall scanner that is capable of providing a plurality of wall scanning technologies and a high-resolution display in a single hand-held device. Embodiments also include a wall scanner that is ergonomically designed to provide a comfortable and easy-to-grip handle portion, a control section accessible with a single hand while that hand grips the handle portion, and a display that is not obstructed by a user's hand during normal operation of the wall scanner.

In one embodiment, the invention provides a wall scanner that includes a housing, a plurality of sensors, a display, a control section, and a plurality of wheels. The housing includes a handle portion and a body portion. The handle portion is adapted to receive a high-voltage removable and rechargeable battery pack, such as a lithium-ion ("Li-Ion") battery pack (e.g., a 12V Li-Ion battery pack). The body portion of the housing encloses the plurality of sensors, such as, for example, capacitive plate sensors for sensing the presence of a stud behind a surface, a D-coil sensor for identifying the presence of metal behind the surface, and a non-contact voltage sensor for detecting the presence of live wires carrying AC currents behind the surface. The display is, for example, a negative LCD ("NLCD"), and is configured to display a plurality of status indications related to the operation of the wall scanner. For example, the display can display, among other things, the operational mode of the wall scanner, the location of an object behind the surface in real-time, the depth of an object behind the surface, and whether an object behind the surface is ferrous or non-ferrous. The control section includes a plurality of actuation devices for controlling the functions and operations of the wall scanner, such as the scanning mode. The plurality of wheels allow the wall scanner to roll along the surface in a linear manner.

In one embodiment, the invention provides a wall scanner for sensing objects behind a surface. The wall scanner includes a housing having a body portion and a handle portion, a first sensor, a second sensor, and a non-contact voltage sensor. The handle portion forms a first axis and includes a first recess. The first recess is operable to receive a removable battery pack along the first axis. The first sensor is of a first sensor type and senses a first object of a first object type behind the surface. The second sensor is of a second sensor type and senses a second object of a second object type behind the surface. The first sensor type is different than the second sensor type, and the first object type is different than the second object type. The non-contact voltage sensor is operable to detect a medium carrying an alternating current behind the surface, and the display is configured to display a plurality of indications to a user. The indications include at least an indication of a depth of the second object behind the surface and a graphical representation of the location of the first object behind the surface.

In another embodiment, the invention provides a method for operating a wall scanner that includes a handle portion. The method includes inserting a removable battery pack into a receiving chamber of the handle portion, sensing a first object of a first object type behind a surface using a first sensor of a first sensor type, and sensing a second object of a second object type behind the surface using a second sensor of a second sensor type. The first sensor type is different than the second sensor type, and the first object type is different than the second object type. The method also includes detecting, using a non-contact voltage sensor, a medium carrying an alternating current behind the surface, and displaying, on a display, a plurality of indications to a user. The indications include at least an indication of a depth of the second object behind the surface and a graphical representation of the location of the first object behind the surface.

Other aspects of the invention will become apparent by consideration of the detailed description and accompanying drawings.

DETAILED DESCRIPTION

Figure 1:
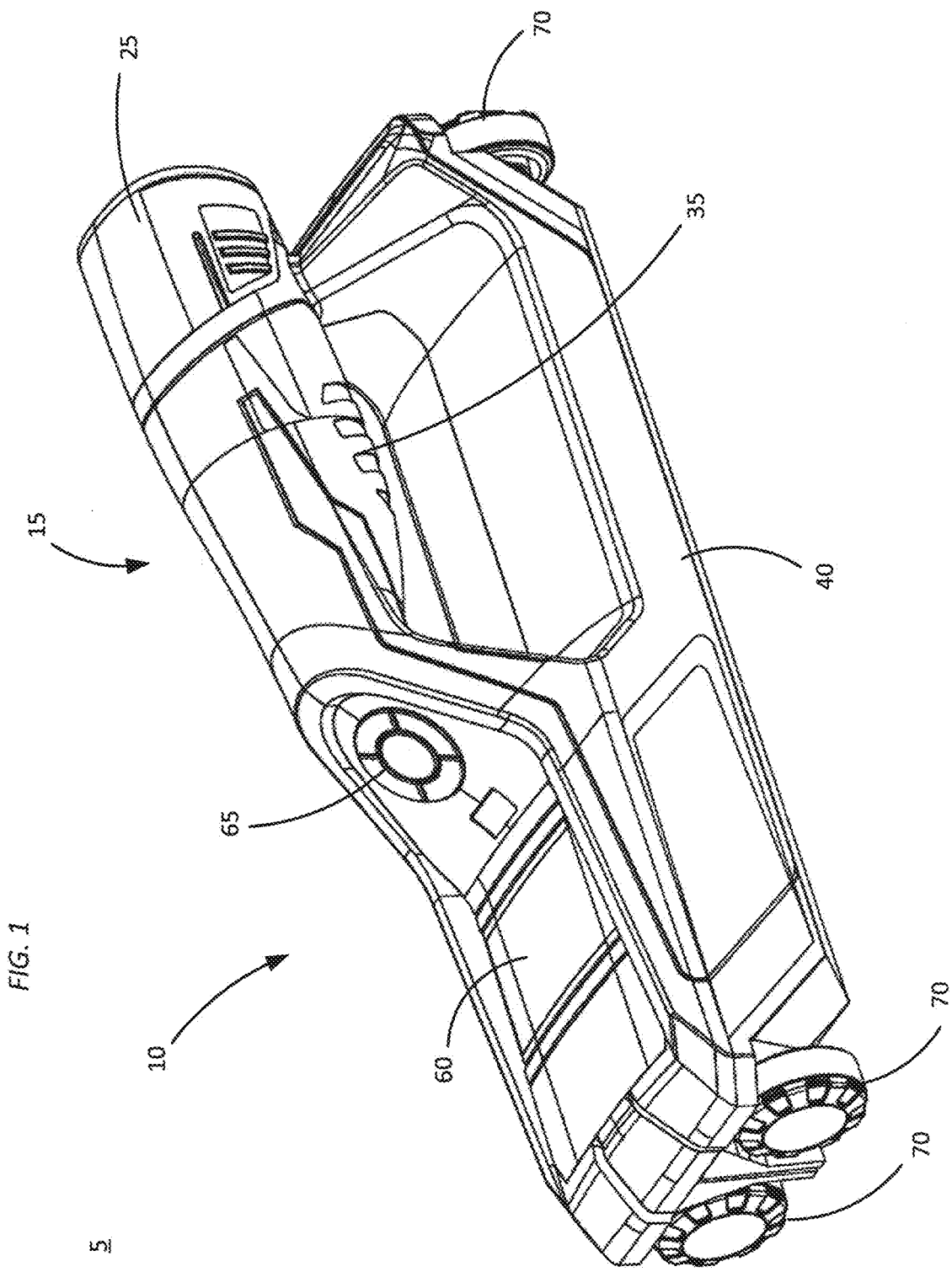
FIG. 1 illustrates a perspective view of a wall scanner according an embodiment of the invention.
Figure 2:
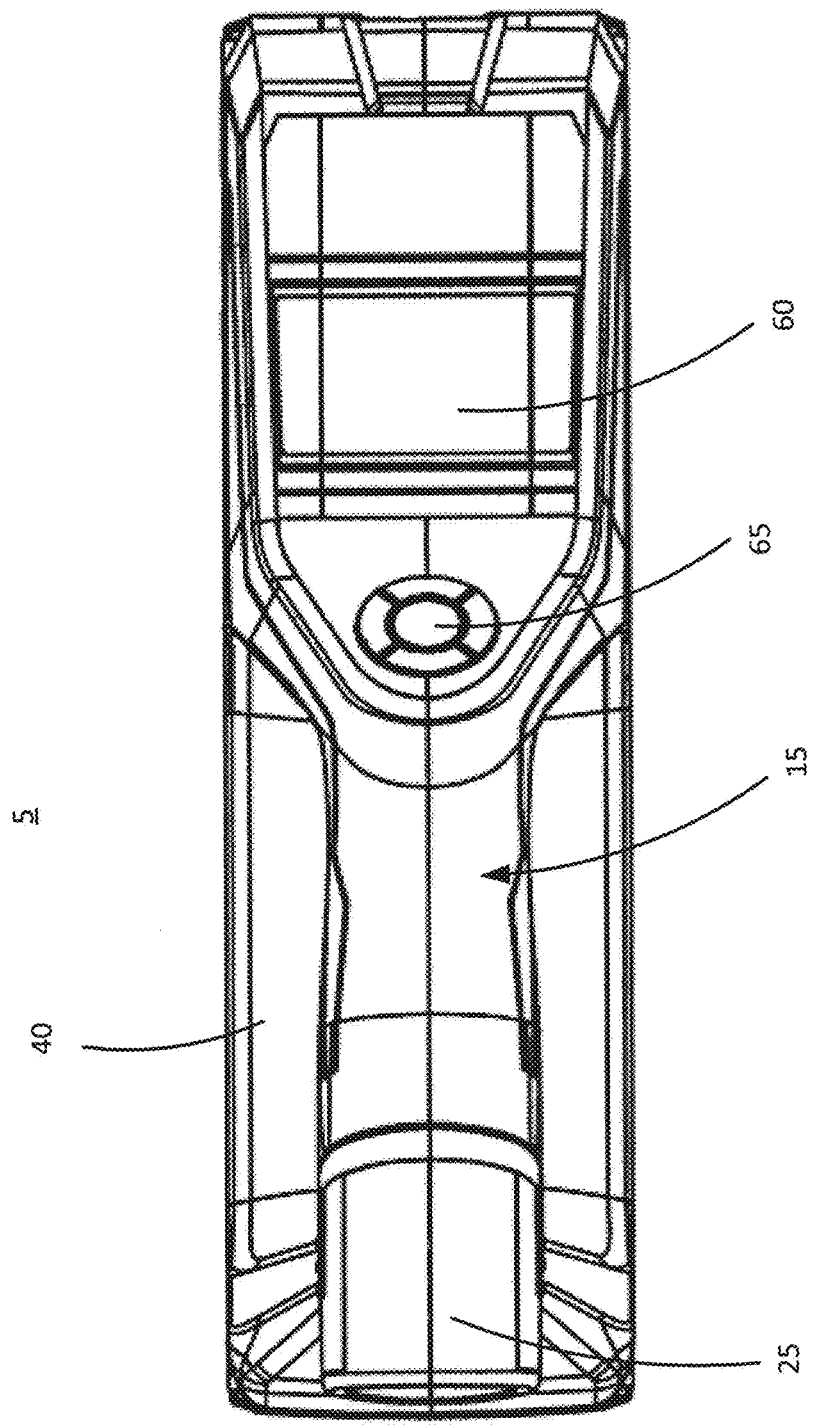
FIG. 2 illustrates a top view of the wall scanner of FIG. 1.
Figure 3:
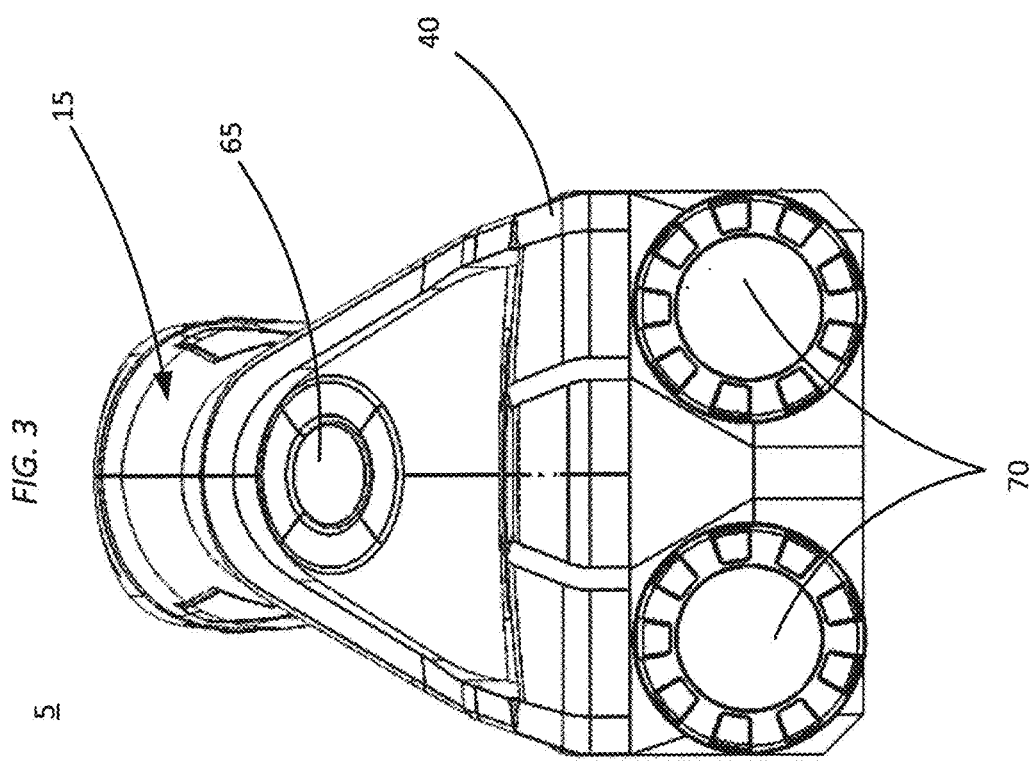
FIG. 3 illustrates a front view of the wall scanner of FIG. 1.
Figure 4:
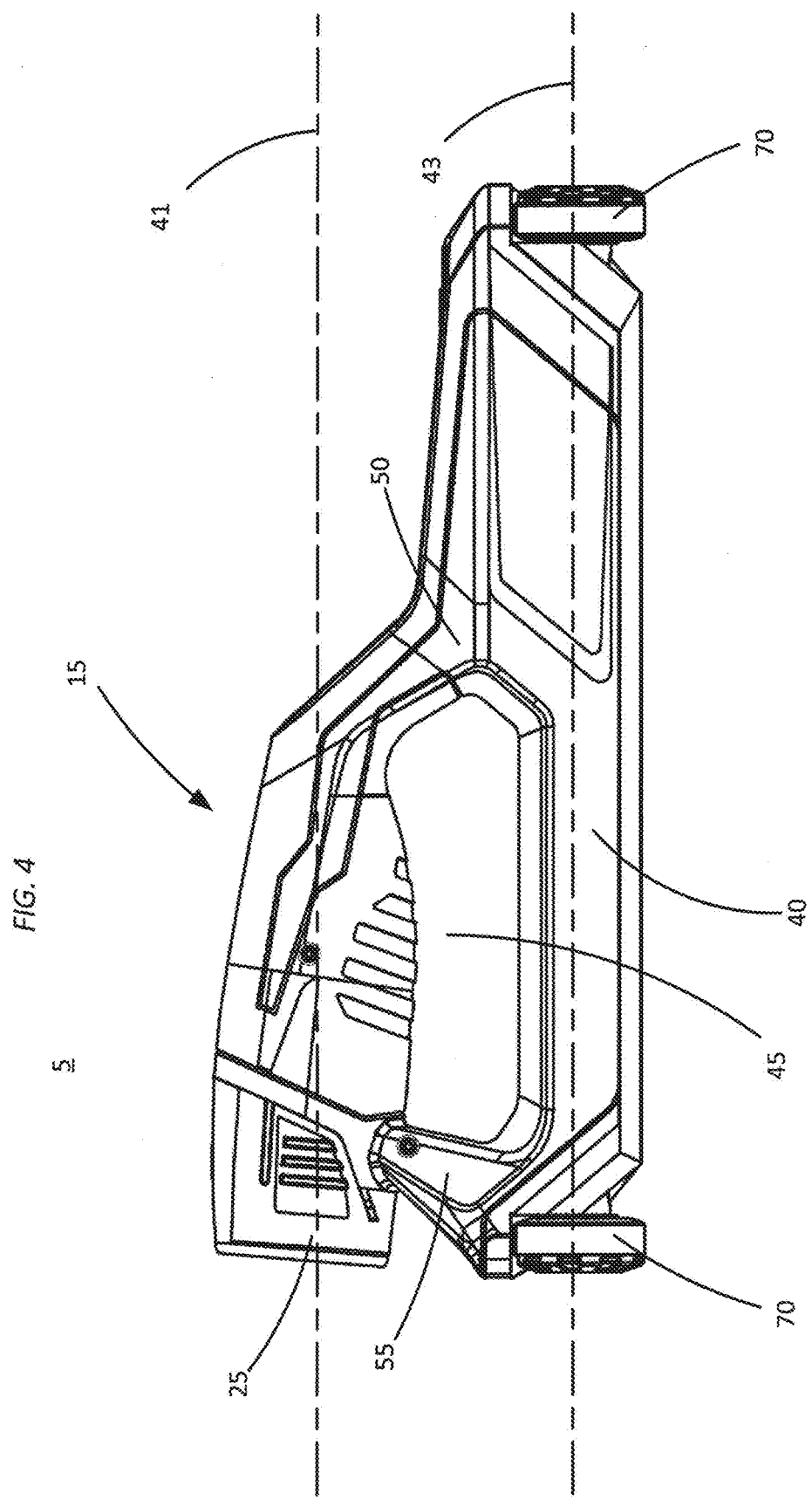
FIG. 4 illustrates a side view of the wall scanner of FIG. 1.

Before any embodiments of the invention are explained in detail, it is to be understood that the invention is not limited in its application to the details of construction and the arrangement of components set forth in the following description or illustrated in the following drawings. The invention is capable of other embodiments and of being practiced or of being carried out in various ways. Also, it is to be understood that the phraseology and terminology used herein is for the purpose of description and should not be regarded as limiting. The use of "including," "comprising," or "having" and variations thereof herein is meant to encompass the items listed thereafter and equivalents thereof as well as additional items. Unless specified or limited otherwise, the terms "mounted," "connected," "supported," and "coupled" and variations thereof are used broadly and encompass both direct and indirect mountings, connections, supports, and couplings. Further, "connected" and "coupled" are not restricted to physical or mechanical connections or couplings.

Various embodiments herein describe a wall scanner that is capable of detecting a plurality of objects hidden behind a plurality of different surfaces. The wall scanner includes a housing, a plurality of sensors, a display, a control section, and a plurality of wheels. The housing includes a handle portion and a body portion. The handle portion includes a recess that is adapted to receive a high-voltage removable and rechargeable battery pack.

As a result of receiving operational power from the high-voltage removable and rechargeable battery pack, the wall scanner is capable of including a variety of additional features or functions that demand increased power. For example, the wall scanner can include a high-intensity LED flashlight, a backlighted control section or actuators, a high-resolution LCD, a color LCD, and/or an additional or remote display. Conventionally powered wall scanners (e.g., wall scanners powered by alkaline batteries) are unable to provide the required voltage and current to power these additional features, or the operational runtime (i.e., the amount of time for which the batteries can power the wall scanner before the batteries need to be replaced or recharged) of the alkaline batteries is shortened. In contrast, the high-voltage removable and rechargeable battery pack of a wall scanner according to embodiments of the invention is capable of powering both the additional features of the wall scanner and the described sensing and display features, while maintaining an operational runtime that is comparable to or longer than a conventional wall scanner that does not include additional features.

FIGS. 1-4 illustrate the wall scanner 5 and housing 10 according to an embodiment of the invention. A handle portion 15 of the wall scanner housing 10 includes a battery pack recess 20 (see FIG. 5) adapted to receive a high-voltage removable and rechargeable battery pack 25. The battery pack recess 20 includes a plurality of terminals (shown as 145 in FIG. 7) for electrically connecting the battery pack 25 to the wall scanner 5. Additionally, the handle portion 15 includes a plurality of recessed gripping portions 35 that provide additional grip to a user.

The handle portion 15 and the battery pack 25 define a first axis 41 of the wall scanner 5. The handle portion 15 is coupled to and extends from the body portion 40 of the wall scanner 5 such that a recess 45 is formed between the body portion 40 and the handle portion 15. The extension of the handle portion 15 from the body portion 40 allows the wall scanner 5 to receive the battery pack 25. In some embodiments, the recess 45 between the handle portion 15 and the body portion 40 is closed by first and second connecting portions 50 and 55. In other embodiments, the recess 45 is open and includes a single connecting portion. The recess 45 defines a space for accommodating the fingers of a user while the user is holding the wall scanner 5.

The handle portion 15 extends approximately half the length of the housing 10 and is approximately parallel to the body portion 40 and a display 60. In one embodiment, the first axis 41 is parallel to a second axis 43 which extends through a center of the body portion 40. In other embodiments, the first axis 41 is not parallel to the second axis 43, and the first axis 41 intersects the second axis 43 at a point a distance, d, away from the wall scanner 5. The display 60 is positioned on the body portion 40 such that the display 60 is not blocked by the user's hand when the wall scanner 5 is being gripped. The control section 65 is provided on the first connecting portion 50 between the body portion 40 and the handle portion 15 of the wall scanner 5. The control section 65 is positioned at an oblique angle with respect to the body portion 40 of the housing such that the buttons or switches (described below) within the control section 65 can be activated by the user using the same hand with which the user is gripping the wall scanner 5. In some embodiments, the wall scanner 5 also includes one or more LEDs for providing an indication to the user of the status of the wall scanner 5, the battery pack 25, or both. The wheels 70 are rotatably coupled to the housing 10 to facilitate movement of the wall scanner 5 along a surface. In the illustrated embodiment, the wheels 70 are idle wheels, but may alternatively be driven wheels that are powered by the battery pack 25.

Figure 5:
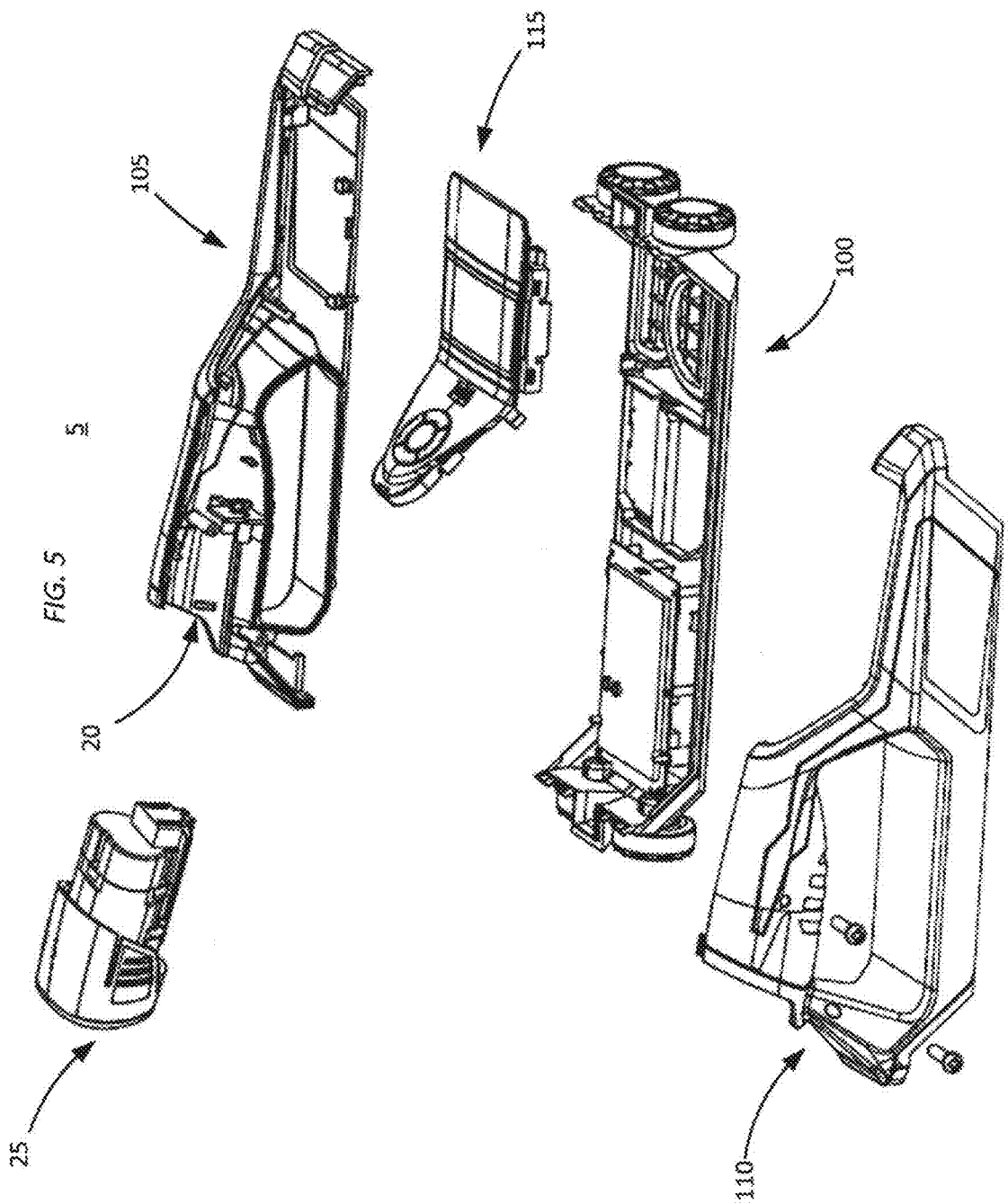
FIG. 5 illustrates an exploded view of the wall scanner of FIG. 1.
Figure 6:
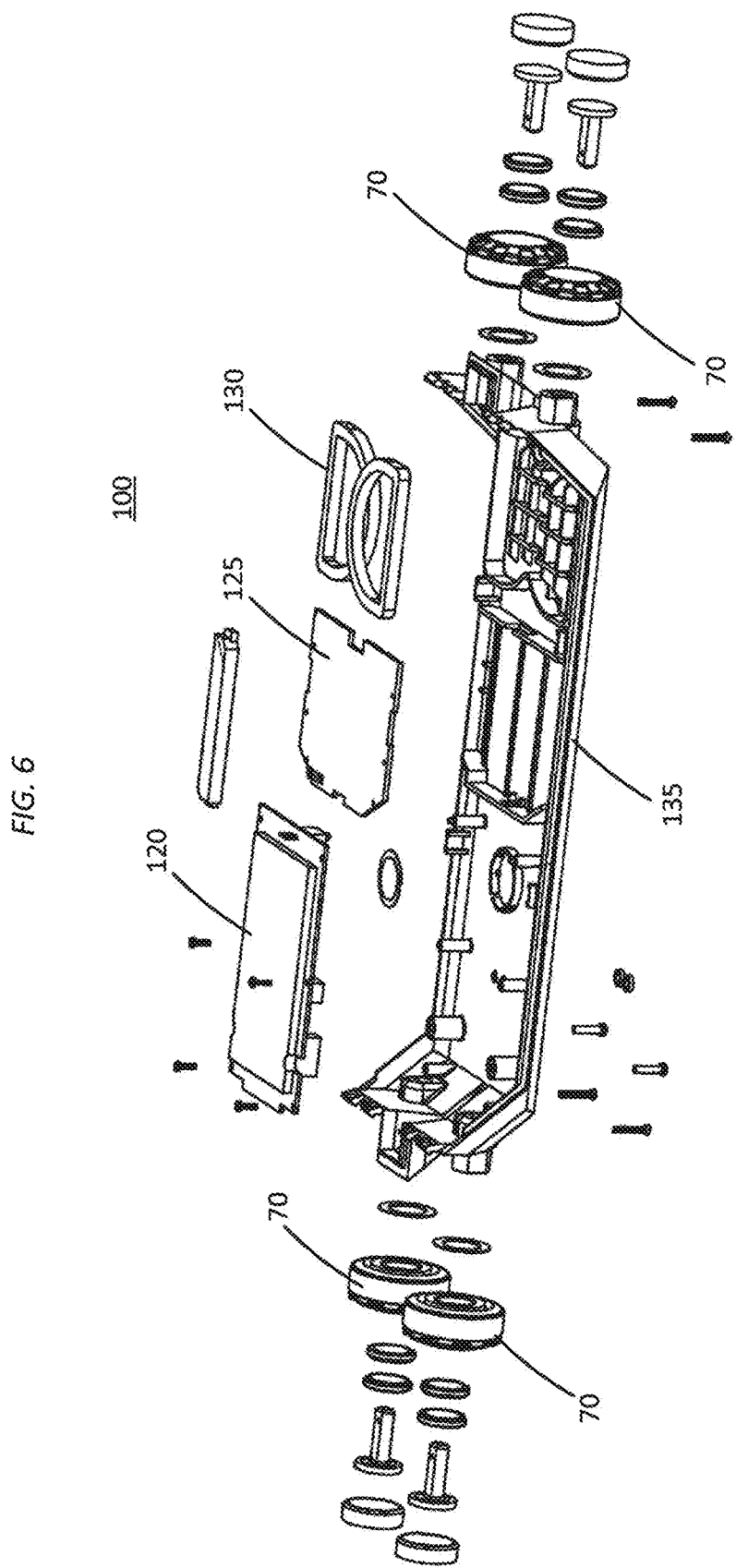
FIG. 6 illustrates an exploded view of a lower portion of the wall scanner of FIG. 1.
Figure 7:
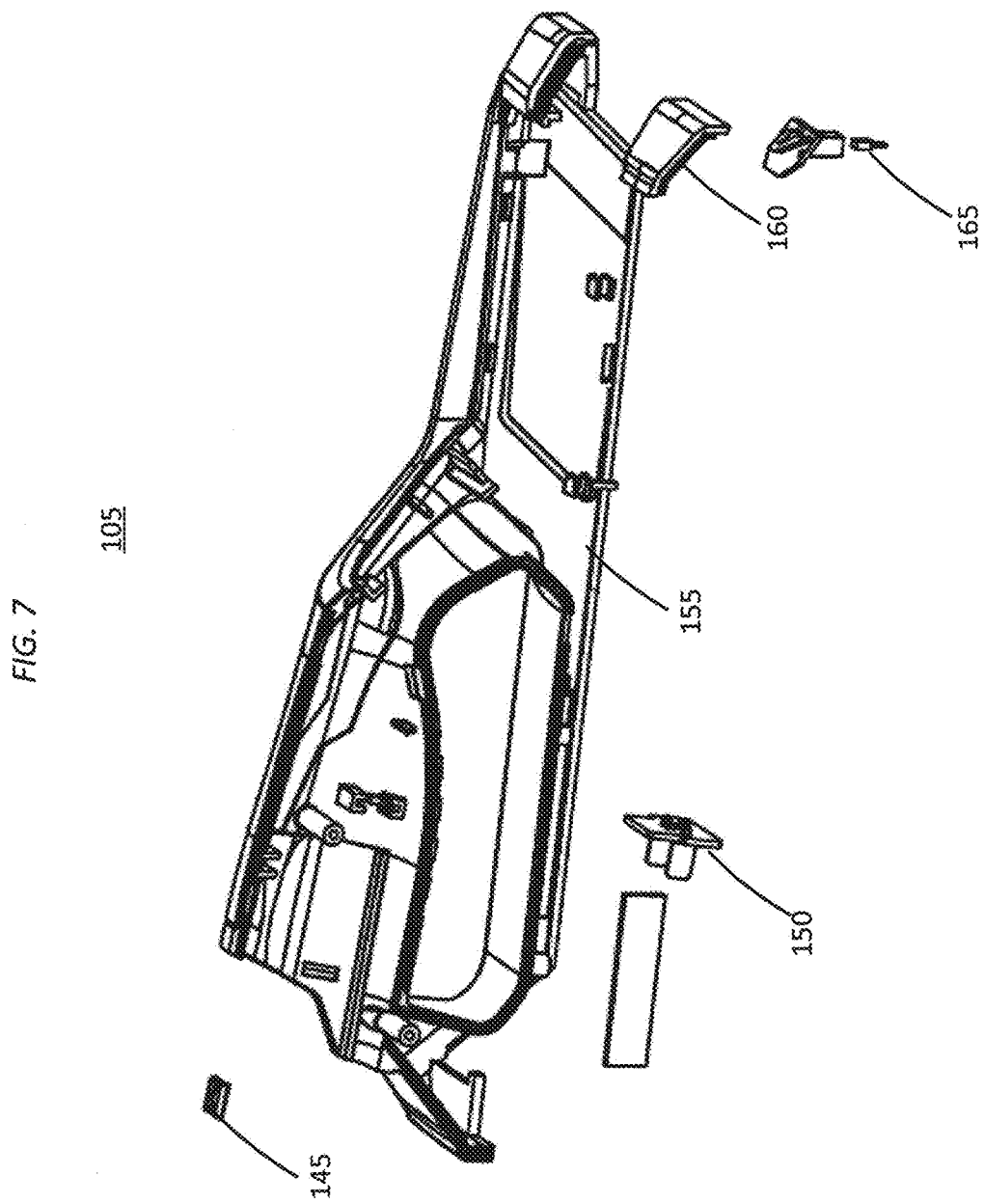
FIG. 7 illustrates an exploded view of a side portion of the wall scanner of FIG. 1.
Figure 8:
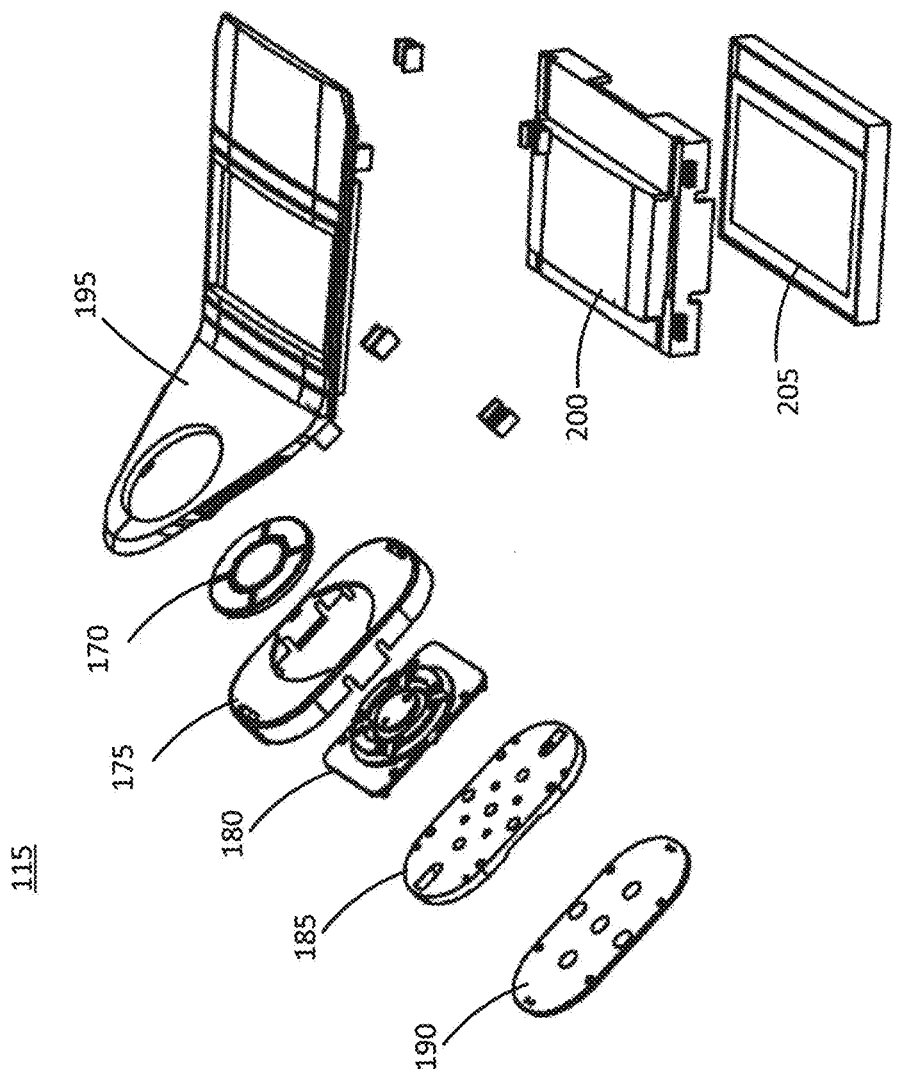
FIG. 8 illustrates an exploded view of a control section and a display according to an embodiment of the invention.

FIG. 5 illustrates an exploded view of the wall scanner 5 shown in FIGS. 1-4. The wall scanner 5 includes a base housing assembly 100, right and left housing assemblies 105 and 110, a panel assembly 115, and the battery pack 25. An exploded view of the base housing assembly 100 is shown in FIG. 6. The base housing assembly 100 includes a main printed circuit board assembly ("PCB") 120, a sensor board 125 which includes plate sensors for sensing studs, a D-coil sensor 130 for sensing metal, a base 135, and the wheels 70. An exploded view of the right housing assembly 105 is shown in FIG. 7. The left housing assembly 110 is similar to the right housing assembly 105 and is not described in detail. The right housing assembly 105 includes contact plate terminals 145, a battery contact PCB 150, a right half of the housing 155, an indicator lens 160, and an LED 165. An exploded view of the panel assembly 115 is shown in FIG. 8. The panel assembly 115 includes a keypad 170, a key holder 175, a rubber key 180, a light guide 185, a key PCB 190, a key panel 195, an LCD lens 200, and an LCD assembly 205.

Figure 9:
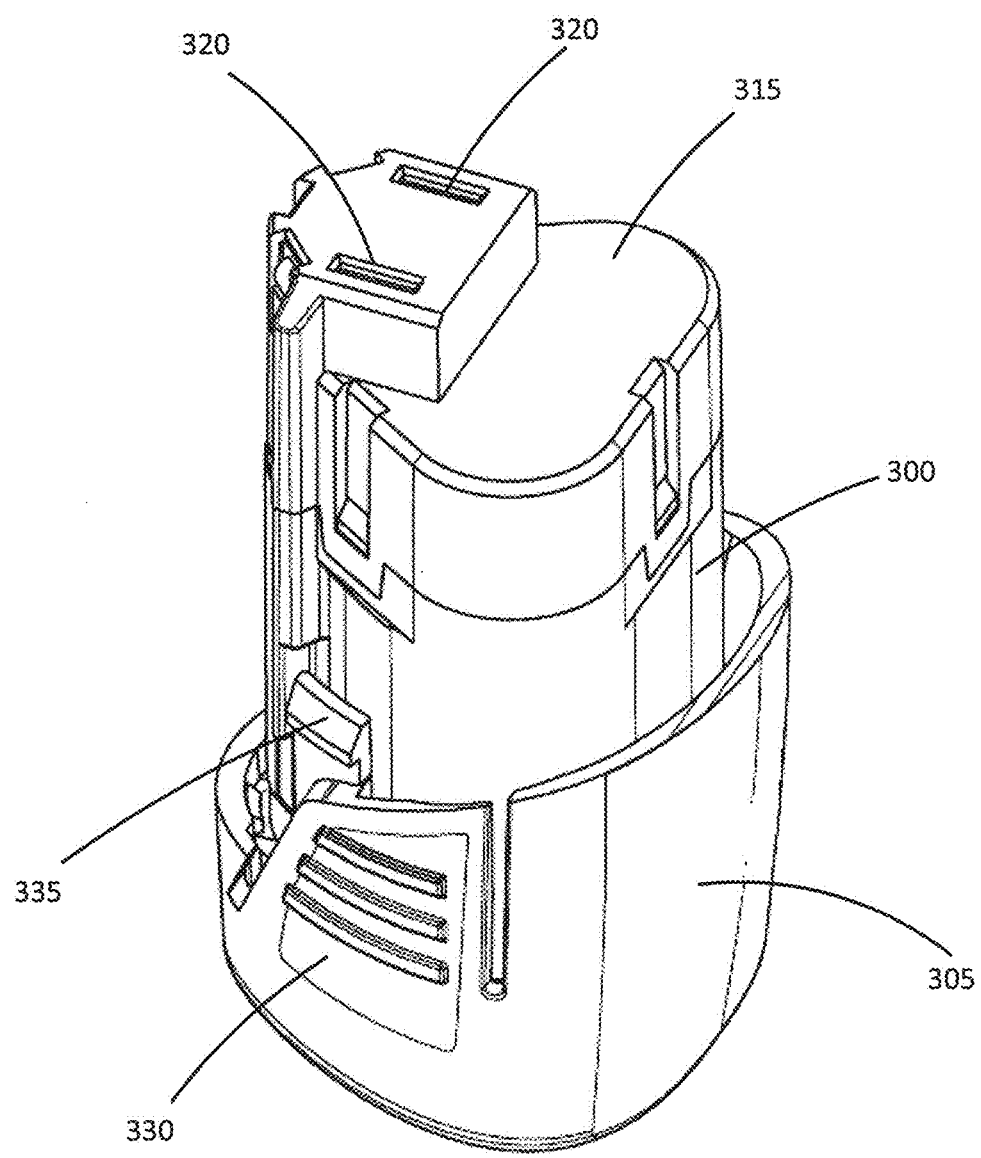
FIG. 9 is a perspective view of a battery pack.
Figure 10:
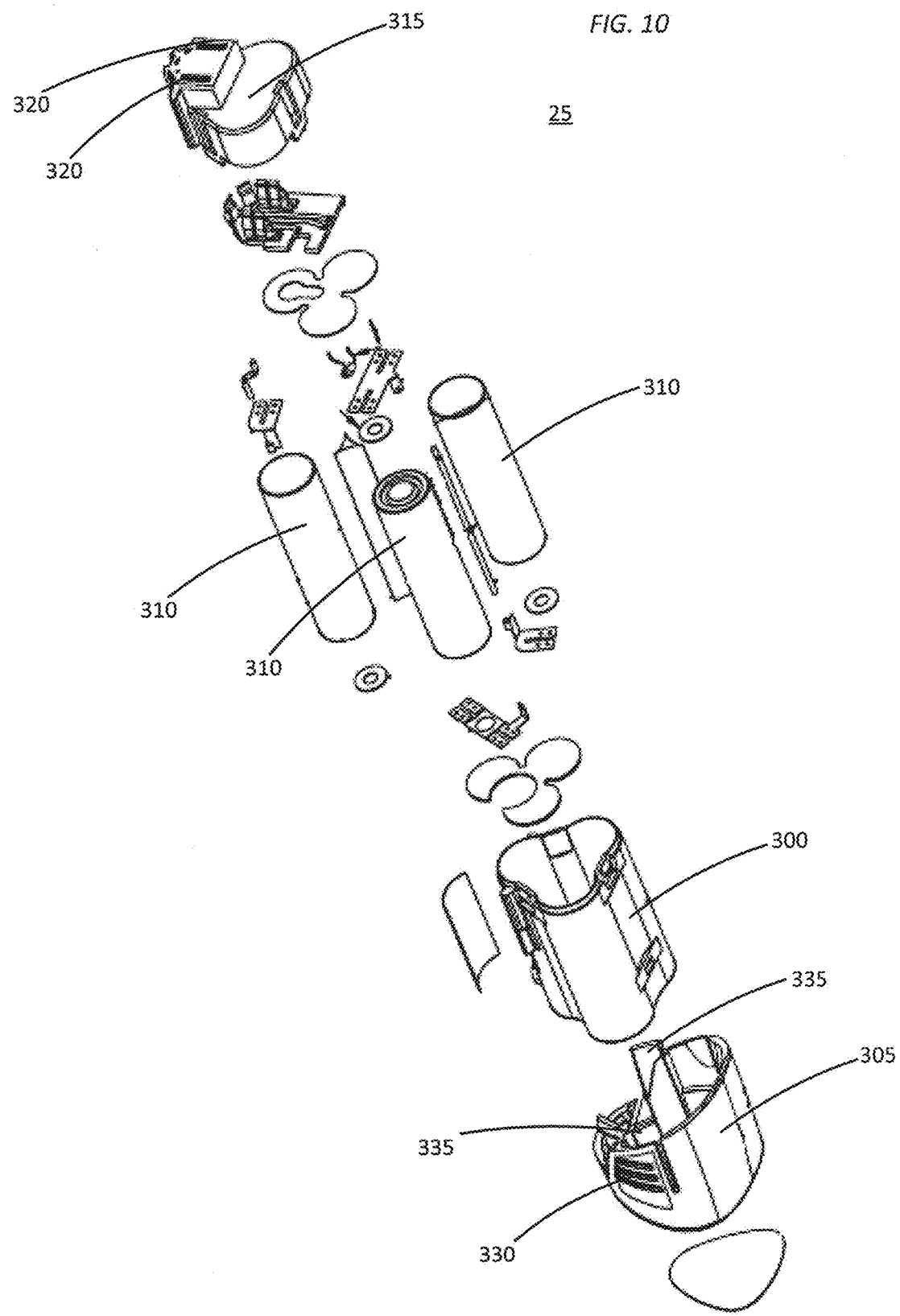
FIG. 10 is an exploded view of the battery pack of FIG. 9.
Figure 11:
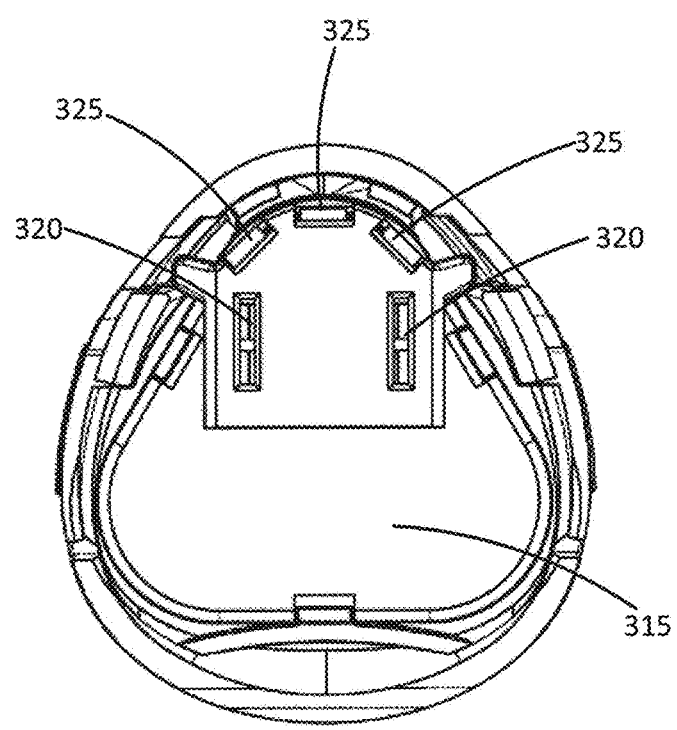
FIG. 11 is a top view of the battery pack of FIG. 9.

FIGS. 9, 10, and 11 illustrate the battery pack 25 for use with the wall scanner 5. In the illustrated embodiment, the battery pack 25 includes battery cells having a lithium-based chemistry such that the battery pack 25 is over 65% lighter and 50% smaller than an equivalent nickel-cadmium ("NiCd") battery pack. The lithium-ion battery pack 25 also provides a longer operational run-time for the wall scanner 5, and a longer life (e.g., number of recharge cycles) than other non-lithium based battery packs.

The illustrated battery pack 25 includes a casing 300, an outer housing 305 coupled to the casing 300, and a plurality of battery cells 310 (shown in FIG. 10) positioned within the casing 300. The casing 300 is shaped and sized to fit within the recess 20 in the wall scanner 5 to connect the battery pack 25 to the wall scanner 5. The casing 300 includes an end cap 315 to substantially enclose the battery cells 310 within the casing 300. The illustrated end cap 315 includes two power terminals 320 configured to mate with corresponding power terminals 145 of the wall scanner 5. In other embodiments, the end cap 315 may include terminals that extend from the battery pack 25 and are configured to be received in receptacles supported by the wall scanner 5. The end cap 315 also includes sense or communication terminals 325 (shown in FIG. 11) that are configured to mate with corresponding terminals of the wall scanner 5. The terminals 325 couple to a battery circuit (not shown). The battery circuit can be configured to monitor various aspects of the battery pack 25, such as pack temperature, pack and/or cell state of charge, etc. and can also be configured to send and/or receive information and/or commands to and/or from the wall scanner. In one embodiment, the battery circuit operates as illustrated and described in U.S. Pat. No. 7,157,882 entitled "METHOD AND SYSTEM FOR BATTERY PROTECTION EMPLOYING A SELECTIVELY-ACTUATED SWITCH," issued Jan. 2, 2007, the entire contents of which are hereby incorporated by reference. In another embodiment, the battery circuit operates as illustrated and described in U.S. Patent Publication No. 2006/0091858 entitled "METHOD AND SYSTEM FOR BATTERY PROTECTION," filed May 24, 2005, the entire contents of which are also hereby incorporated by reference.

The casing 300 and power terminals 320 substantially enclose and cover the terminals 145 of the wall scanner 5 when the pack 25 is positioned in the recess 20. That is, the battery pack 25 functions as a cover for the recess 20 and terminals 145 of the wall scanner 5. Once the battery pack 25 is disconnected from the wall scanner 5 and the casing is removed from the recess 20, the battery terminals 145 on the wall scanner are generally exposed to the surrounding environment.

The outer housing 305 is coupled to an end of the casing substantially opposite the end cap 315 and surrounds a portion of the casing 300. In the illustrated construction, when the casing 300 is inserted into or positioned within the corresponding recess 20 in the wall scanner 5, the outer housing 305 generally aligns with an outer surface of the wall scanner 5. In this construction, the outer housing 305 is designed to substantially follow the contours of the wall scanner 5 to match the general shape of the housing 10. In such embodiments, the outer housing 305 generally increases (e.g., extends) the length of the handle portion 15 of the wall scanner 5.

In the illustrated embodiment, two actuators 330 (only one of which is shown) and two tabs 335 are formed in the outer housing 305 of the battery pack 25. The actuators 300 and the tabs 335 define a coupling mechanism for releasably securing the battery pack 25 to the wall scanner 5. Each tab 335 engages a corresponding recess formed in the wall scanner 5 to secure the battery pack 25 in place. The tabs 335 are normally biased away from the casing 300 (i.e., away from each other) due to the resiliency of the material forming the outer housing 305. Actuating (e.g., depressing) the actuators 330 moves the tabs 335 toward the casing 300 (i.e., toward each other) and out of engagement with the recesses such that the battery pack 25 may be pulled out of the recess 20 and away from the wall scanner 5. Such an arrangement allows a user to quickly remove the battery pack 25 from the wall scanner 5 for recharging or replacement without the use of tools. In other embodiments, the battery pack 25 may include other suitable coupling mechanisms to releasably secure the battery pack 25 to the wall scanner 5, as discussed below.

As shown in FIG. 10, the battery pack 25 includes three battery cells 310 positioned within the casing 300 and electrically coupled to the terminals 320. The battery cells 310 provide operational power (e.g., DC power) to the wall scanner 5. In the illustrated embodiment, the battery cells 310 are arranged in series, and each battery cell 310 has a nominal voltage of approximately four-volts ("4.0V"), such that the battery pack 25 has a nominal voltage of approximately twelve-volts ("12V"). The cells 310 also have a capacity rating of approximately 1.4 Ah. In other embodiments, the battery pack 25 may include more or fewer battery cells 310, and the cells 310 can be arranged in series, parallel, or a serial and parallel combination. For example, the pack 25 can include a total of six battery cells 310 in a parallel arrangement of two sets of three series-connected cells. The series-parallel combination of battery cells 310 creates a battery pack 25 having a nominal voltage of approximately 12V and a capacity rating of approximately 2.8 Ah. In other embodiments, the battery cells 310 may have different nominal voltages, such as, for example, 3.6V, 3.8V, 4.2V, etc., and/or may have different capacity ratings, such as, for example, 1.2 Ah, 1.3 Ah, 2.0 Ah, 2.4 Ah, 2.6 Ah, 3.0 Ah, etc. In other embodiments, the battery pack 25 can have a different nominal voltage, such as, for example, 10.8V, 14.4V, etc. In the illustrated embodiment, the battery cells 310 are lithium-ion battery cells having a chemistry of, for example, lithium-cobalt ("Li—Co"), lithium-manganese ("Li—Mn"), or Li—Mn spinel. In other embodiments, the battery cells 310 may have other suitable lithium or lithium-based chemistries.

Figure 12:
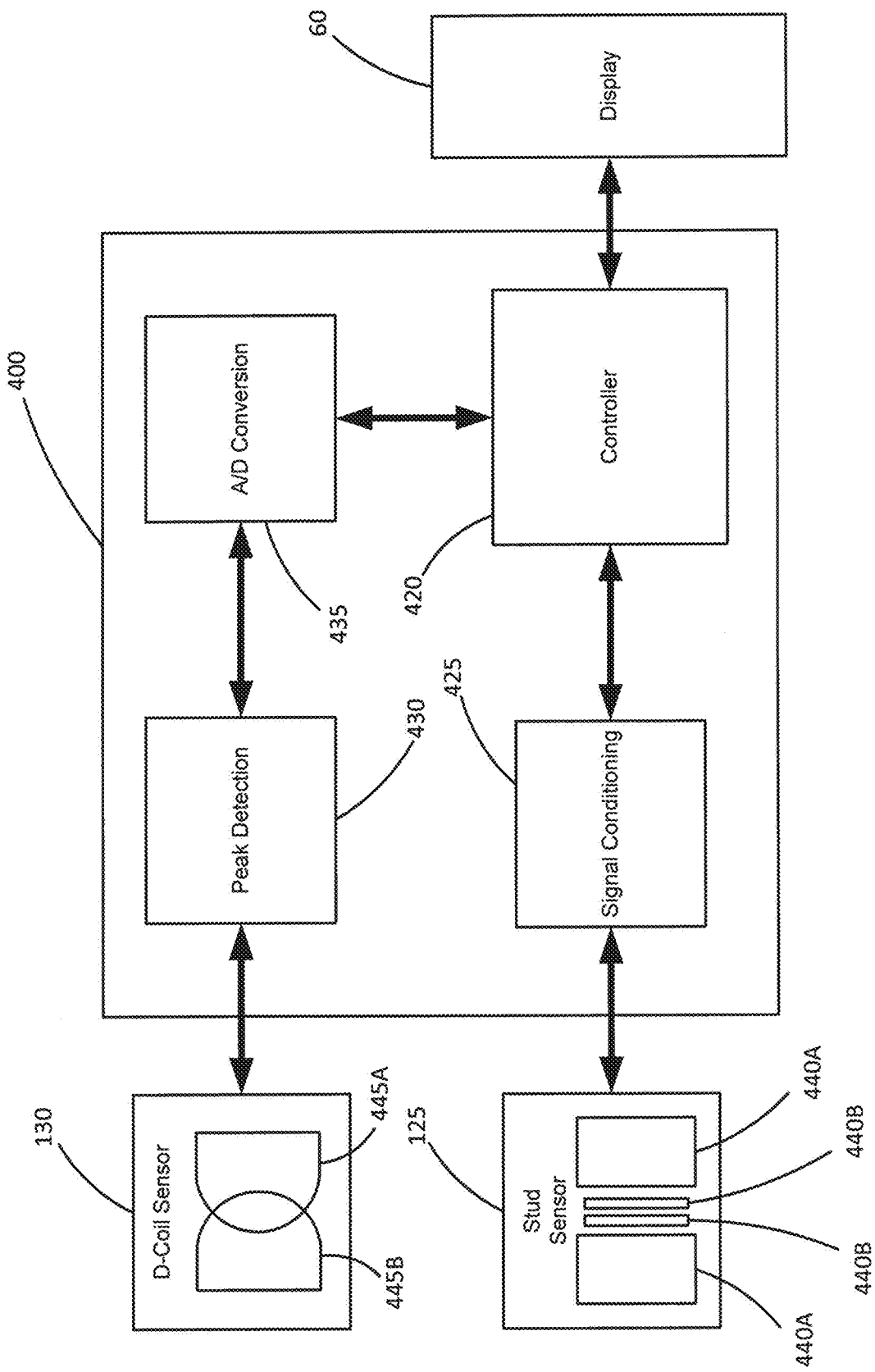
FIG. 12 is a block diagram of a wall scanner according to an embodiment of the invention.

FIG. 12 is a block diagram of a wall scanner 5 according to an embodiment of the invention. The wall scanner 5 includes a main system module 400, the stud sensor 125, the D-coil sensor 130, and the display 60. The main system module 400 includes, among other things, a wall scanner controller 420, a signal conditioning module 425, a peak detection module 430, and an analog-to-digital conversion module 435. The display 60 is, for example, a 128×64 dot matrix liquid crystal display ("LCD") or negative LCD ("NLCD"). The wall scanner controller 420 includes, for example, a PCB such as PCB 120 shown in FIG. 6. The PCB 120 is populated with a plurality of electrical and electronic components which provide operational control and protection to the wall scanner 5. In some embodiments, the PCB 120 includes a control or processing unit such as a microprocessor, a microcontroller, or the like. In some embodiments, the controller 420 includes, for example, the processing unit, a memory, and a bus. The bus connects various components of the controller 420 including the memory to the processing unit. The memory includes, in many instances, read only memory ("ROM") and random access memory ("RAM"). The controller 420 also includes an input/output system that includes routines for transferring information between components within the controller 420. Software included in the implementation of the wall scanner 5 is stored in the ROM or RAM of the controller 420. The software includes, for example, firmware applications and other executable instructions. In other embodiments, the controller 420 can include additional, fewer, or different components.

The PCB 120 also includes, for example, a plurality of additional passive and active components such as resistors, capacitors, inductors, integrated circuits, and amplifiers. These components are arranged and connected to provide a plurality of electrical functions to the PCB 120 including, among other things, filtering, signal conditioning, and voltage regulation. For descriptive purposes, the PCB 120 and the electrical components populated on the PCB 120 are collectively referred to herein as "the controller" 420. The controller 420 receives signals from the sensors within the wall scanner, conditions and processes the signals, and transmits processed and conditioned signals to the display 60. The display 60 receives the processed and conditioned signals and displays an indication of a sensed characteristic of an object hidden behind a surface. The signal conditioning module 425 provides signals to and receives signals from the stud sensor 125, as described below; the peak detection module 430 receives signals from and sends signals to the D-coil sensor 130, as described below; and the analog-to-digital conversion module 435 provides the conversion necessary for the controller 420 to interpret analog signals from the D-coil sensor 130.

In some embodiments, a battery pack controller (not shown) can provide information to the wall scanner controller 420 related to a battery pack temperature or voltage level. The wall scanner controller 420 and the battery pack controller also include low voltage monitors and state-of-charge monitors. The monitors are used by the wall scanner controller 420 or the battery pack controller to determine whether the battery pack 25 is experiencing a low voltage condition which may prevent proper operation of the wall scanner 5, or if the battery pack 25 is in a state-of-charge that makes the battery pack 25 susceptible to being damaged. If such a low voltage condition or state-of-charge exists, the wall scanner 5 is shut down or the battery pack 25 is otherwise prevented from further discharging current to prevent the battery pack 25 from becoming further depleted.

The wall scanner 5 is operable to detect the presence of a stud, such as a wood stud or metal joists within residential, commercial, and industrial structures using the stud sensor 125. The wooden studs or metal joists can be detected when hidden behind surfaces composed of, for example, plaster, non-metallic wall materials, wooden panels, wall board, and the like. The stud sensor 125 includes a sensor circuit with a pair of sensors. Each sensor includes a coplanar primary plate 440A with a single side coplanar plate 440B arranged between the primary plates. The presence and location of the stud is then determined in a manner similar to that described in U.S. Patent Application Publication No. 2008/0238403, titled "STUD SENSOR," the entire contents of which are hereby incorporated by reference.

The wall scanner 5 is also configured to operate in a metal scanning mode. The metal scanning mode is operable to detect both ferrous (i.e., iron based) and non-ferrous (e.g., copper) metals within residential, commercial, and industrial structures. While in the metal scanning mode, the wall scanner 5 can detect metal (e.g., rebar, metal conduit, copper piping, etc.) behind surfaces composed of wall board, tile, plaster, brick, or the like. The wall scanner 5 can also detect metal within walls composed of concrete, masonry, wood, brick, or the like. In some embodiments, the wall scanner 5 is operable to sense metal to a depth of, for example, six inches.

The D-coil sensor 130 illustrated in FIG. 6 uses an inductively coupled sensor that includes overlapping D-shaped transmitter and receiver coils 445A and 445B. When the D-coil sensor 130 detects a metallic object, the sensor 130 outputs a signal to the controller 420 indicating the location of the object. The wall scanner 5 detects the presence of metal in a manner similar to that described in U.S. Patent Application Publication No. 2008/0272761, titled "DEVICE AND METHOD OF DETECTING FERRITE AND NON-FERRITE OBJECTS," the entire contents of which are hereby incorporated by reference.

The wall scanner 5 is also configured to detect the presence of "live" (i.e., energized) electrical wiring behind a surface. In some embodiments, the wall scanner 5 includes an AC detection circuit such as that described in U.S. Pat. No. 6,894,508, titled "APPARATUS AND METHOD FOR LOCATING OBJECTS BEHIND A WALL LINING," the entire contents of which are hereby incorporated by reference. In other embodiments, the wall scanner 5 includes a detachable non-contact voltage detector (not shown), such as that described in co-pending U.S. patent application Ser. No. 12/421,187, filed on Apr. 9, 2009 and titled "SLIDABLY ATTACHABLE NON-CONTACT VOLTAGE DETECTOR," the entire contents of which are hereby incorporated by reference, which is slidably attachable to the housing 10 of the wall scanner 5. The wall scanner 5 includes the LED 165 for indicating the detection of an AC voltage. The LED 165 can be located at a first end of the wall scanner 5, such as the end opposite the battery pack 25 (as shown in FIG. 7), on the display 60, or both. The wall scanner 5 is operable to sense the presence of AC voltages regardless of the operational mode of the wall scanner 5 (e.g., metal sensing mode or stud sensing mode), and the wall scanner 5 does not need to be calibrated to detect the presence of AC voltages.

Figure 13:
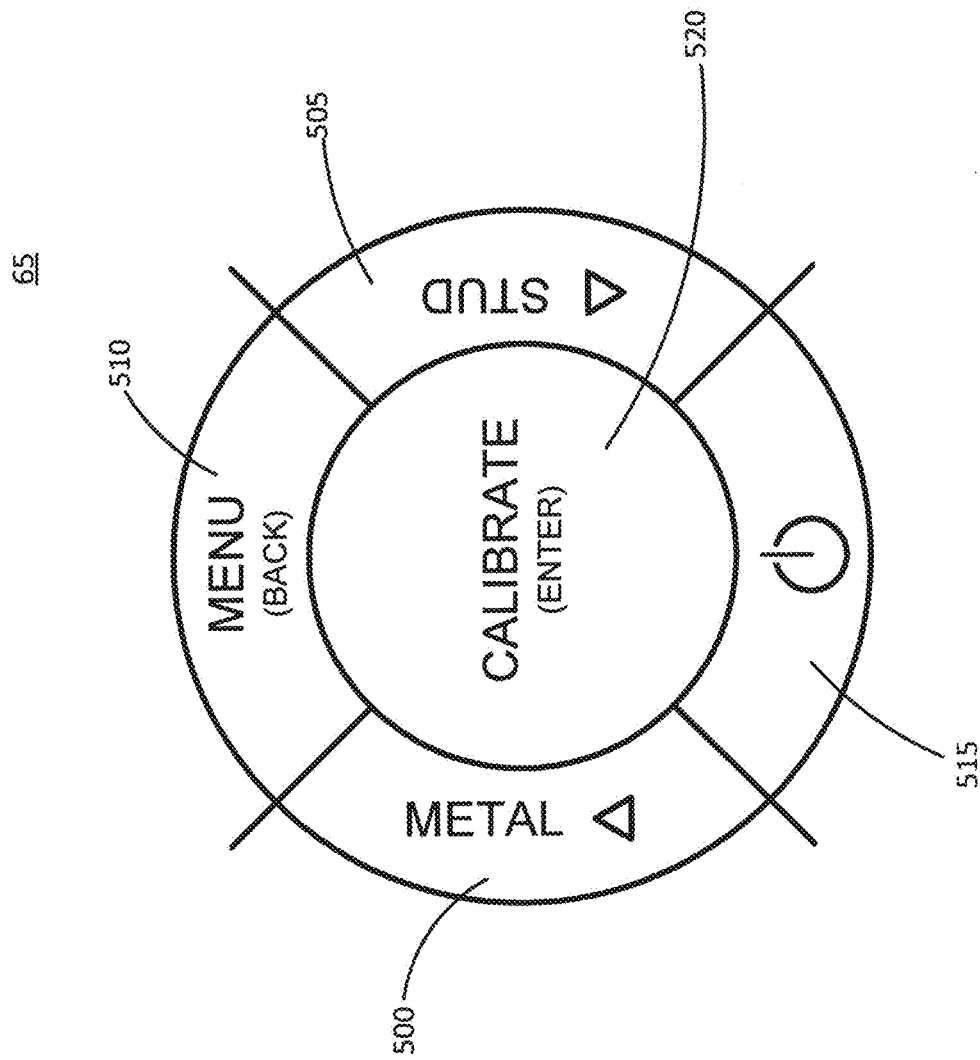
FIG. 13 illustrates a control section of a wall scanner according to an embodiment of the invention.

FIG. 13 illustrates the control section 65 of the wall scanner 5. The control section 65 is positioned between the display 60 and the handle portion 15 along the first axis 41. The control section 65 includes buttons, switches, or other actuation devices for controlling the function and operation of the wall scanner 5. In some embodiments, the control section 65 includes a metal sensing mode button 500, a stud sensing mode button 505, a menu button 510, a power button 515, and a calibration button 520. In other embodiments, the control section 65 includes additional buttons or switches for controlling additional or different features or functions of the wall scanner 5. One or more of the buttons included in the control section 65 may have multiple functions such as selecting an operational mode and enabling a user to scroll through menu options on the display 60. In the illustrated embodiment of the control section 65, the buttons are arranged in a circular manner. In other embodiments, the buttons in the control section 65 can be arranged in a variety of different configurations, such as a grid or an array. In various embodiments of the control section 65, the buttons are configured such that a user can access and select each button using a single hand (e.g., the same hand the user is using to grip the handle portion of the wall scanner).

Figure 14:
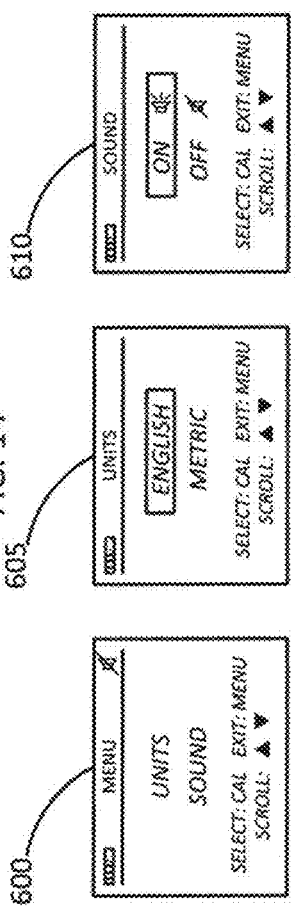
FIG. 14 illustrates a plurality of display screens of a wall scanner according to an embodiment of the invention.
Figure 15:
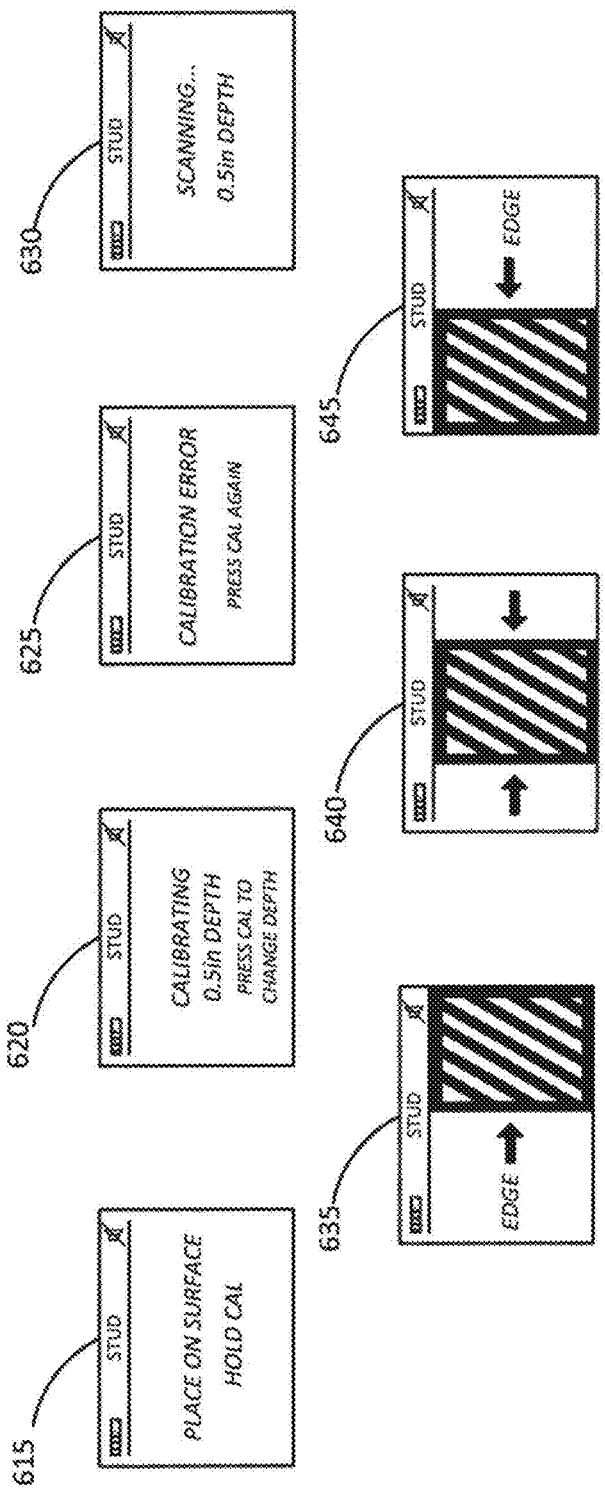
FIG. 15 illustrates a plurality of display screens of a wall scanner in a stud scanning mode according to an embodiment of the invention.
Figure 16:
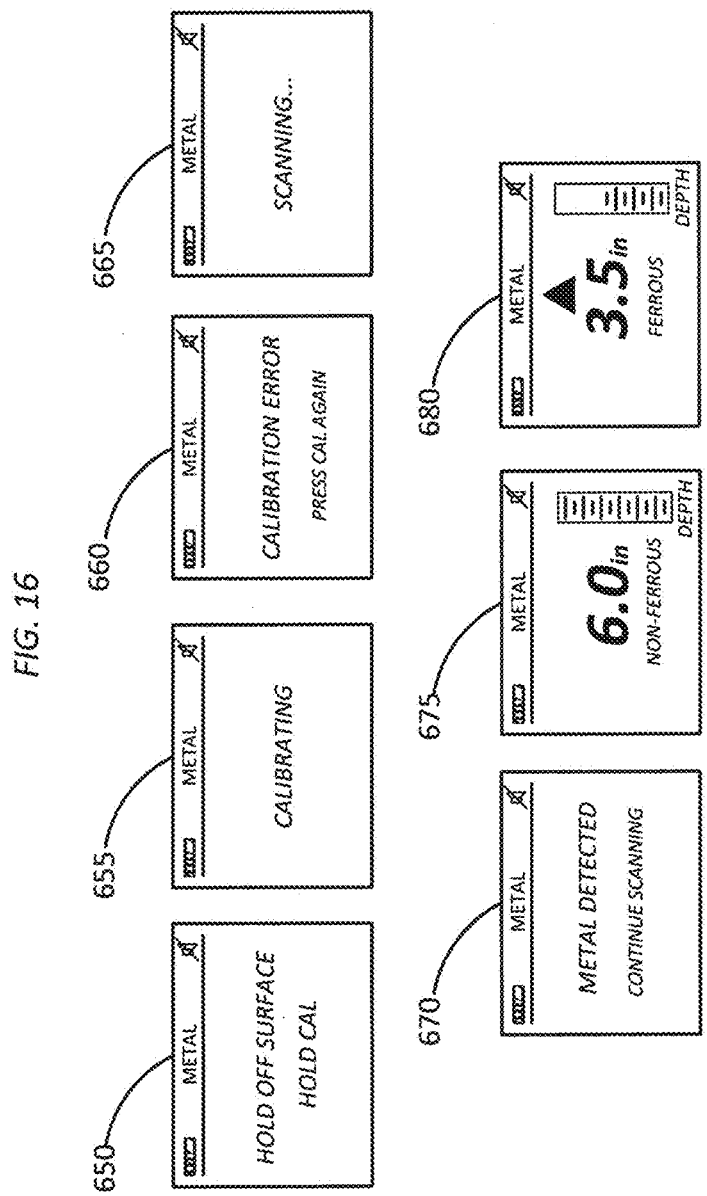
FIG. 16 illustrates a plurality of display screens of a wall scanner in a metal scanning mode according to an embodiment of the invention.

The display 60 is symmetrically aligned along the first axis 41 defined by the handle portion 15 and the battery pack 25. The display 60 is configured to display a plurality of status indications related to the operation of the wall scanner 5. For example, the display 60 can display, among other things, the operational mode of the wall scanner 5, the location of an object hidden behind the surface in real-time, the depth of an object hidden behind the surface, whether an object hidden behind the surface is ferrous or non-ferrous, battery pack power level, and an indication of whether sound (i.e., audible indication) is turned on or off. FIGS. 14-16 illustrate embodiments of wall scanner status indications that the display 60 is configured to display.

The controller 420 receives signals from the sensors, processes or conditions the signals, and transmits the conditioned signals to the display 60, as described above. The display 60 receives the conditioned signals and displays an image, a value (e.g., a distance, coordinates, etc.), an alert relating to the detected object, test results, measurement values, properties of the wall scanner, etc. The display 60 includes lighted symbols, such as white alphanumeric symbols, on a black background. The display 60 improves the visibility of the display in low or poor lighting conditions, such as outdoor, dark, or dirty conditions. Additionally or alternatively, the wall scanner 5 can include a remote display (not shown) that can be attachable to or detachable from the wall scanner 5 to provide the user with a remote display of the detection and/or position of a stud, or the operation of the wall scanner 5. The wall scanner 5 can include a transmitter and a receiver for communicating with the remote display. In some embodiments, the remote display is configured to display the same information as the display 60.

The user can access a menu (screen 600) on the display 60 by activating buttons in the control section 65. From the menu, a list of options relating to various settings of the wall scanner 5 is displayed on the display 60. The user is able to select between English and metric units for displaying the depth or location of an object (screen 605). The user can also select whether sound is activated (screen 610). When sound is activated, the wall scanner 5 produces, for example, a beep or a series of beeps to indicate the presence or depth of an object hidden behind a surface. In other embodiments, the menu is operable to control additional functions such as display screen brightness, turning a backlight on and off, controlling the operation of a remote display, and adjusting wall scanner sensitivities. As such, the wall scanner 5 is a menu-driven device.

The display 60 also provides instructions to the user for calibrating the wall scanner 5 after power-up. When the wall scanner 5 is operating in the stud sensing mode, the user is prompted to place the wall scanner 5 on the surface to be scanned and activate the calibration button 520 (screen 615). The display 60 then indicates to the user that the wall scanner 5 is being calibrated (screen 620). The user can, if desired, manually change the sensitivity (e.g., scan depth) of the wall scanner 5. For example, in one embodiment, a default depth setting of 0.5 inches is set for the wall scanner 5 when in the stud sensing mode. To change the scanning depth, the user activates the calibration button 520 while the wall scanner 5 is calibrating. Activating the calibration button 520 a second time changes the scanning depth from 0.5 inches to 1.0 inches. Activating the calibration button 520 a third time changes the scanning depth from 1.0 inches to 1.5 inches. If the calibration button is activated a fourth time, the scanning depth cycles back to 0.5 in. In other embodiments, the wall scanner 5 is configured with different scanning depths and sensitivities. If an error occurs during calibration, the user is prompted with an error message, such as that shown in screen 625.

After calibration, the display 60 indicates when the wall scanner 5 is scanning for a stud (screen 630). The display 60 is configured to display the location of a detected stud in real-time as the wall scanner 5 is passing over the stud. For example, when the wall scanner 5 is moving from left to right across a surface and a stud is detected, the stud is identified by a partially illuminated portion of the display 60 (e.g., the stud is represented by a combination of illuminated pixels and non-illuminated pixels). The illuminated pixels form a plurality of lines such as horizontal lines, vertical lines, diagonal lines, or any combination thereof which are separated by non-illuminated pixels or lines. The display 60 also includes a visual and/or linguistic identification of the edge of the stud (e.g., an arrow and/or the word "edge" displayed on the wall scanner display), as shown in screen 635. The display 60 can also display both edges of a stud if the width of the stud is not greater than the width of the display 60. In such an instance, each edge is identified by an arrow and/or a linguistic identification, and the stud is represented by a combination of illuminated and non-illuminated portions (screen 640). The wall scanner 5 includes similar visual representations of a stud's location in real-time when the wall scanner is moving from the right to the left (screen 645).

When the wall scanner 5 is operating in the metal sensing mode, the user is prompted to hold the wall scanner 5 off of the surface to be scanned in order for the wall scanner 5 to be properly calibrated (screen 650). Similar to the stud sensing mode, the wall scanner 5 provides an indication on the display that the wall scanner 5 is being calibrated (screen 655). If an error occurs during calibration, the user is prompted with an error message, such as that shown in screen 660. After calibration, the display 60 indicates when the wall scanner 5 is scanning for metal (screen 665). If the wall scanner 5 detects the presence of metal, the user is prompted visually or audibly that metal has been detected (screen 670). The display 60 then provides the user with an indication of whether the detected metal is ferrous or non-ferrous, a numerical indication of the depth of the detected object, and a visual indication of the depth of the object (screen 675). In some embodiments of the invention, the display 60 can also provide a symbol to indicate the nearest distance to a detected metal object (screen 680).

Figure 17:
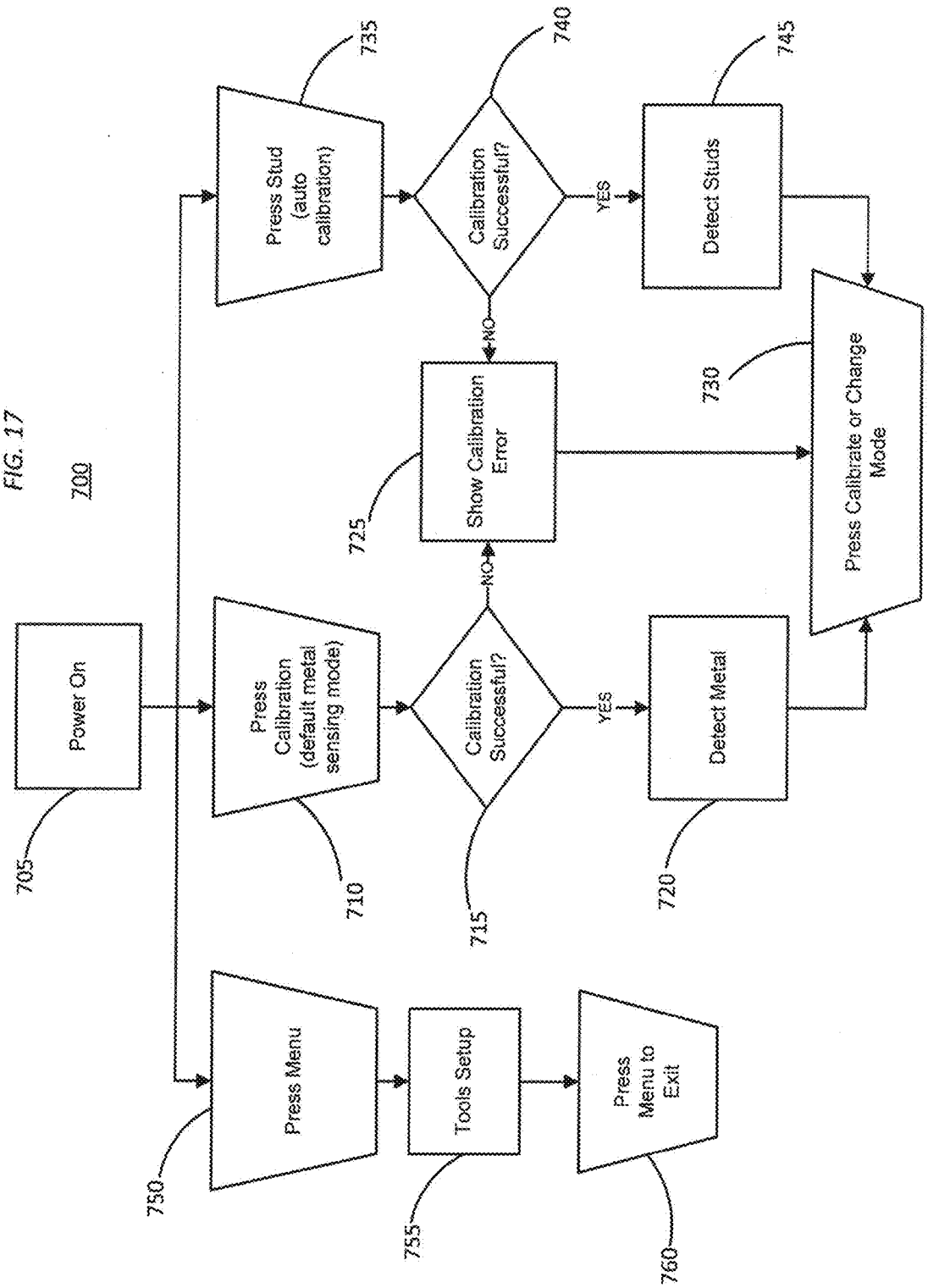
FIG. 17 illustrates a control process for a wall scanner according to an embodiment of the invention.

A process 700 for the general operation of the wall scanner 5 is illustrated in FIG. 17. After the wall scanner 5 is powered up (step 705), the default sensing mode for the wall scanner 5 is the metal sensing mode. To use the wall scanner in the metal sensing mode, the user activates the calibration button 520 from the control section 65 (step 710). If the wall scanner 5 calibrates successfully (step 715), the wall scanner 5 is ready to detect metal objects hidden behind a surface (step 720). If the wall scanner 5 does not calibrate correctly, a calibration error is displayed (step 725), and the wall scanner 5 waits for a user to change sensing modes or activate the calibration button 520 again (step 730). In some embodiments, if a user selects the stud sensing mode (step 735), the wall scanner 5 calibrates automatically. In other embodiments, the user must activate the calibration button 520. If the calibration is successful (step 740), the wall scanner 5 is ready to detect studs hidden behind a surface (step 745). If the calibration is not successful, a calibration error is displayed (step 725), and the wall scanner 5 waits for the user to change sensing modes or activate the calibration button 520 again (step 730). Following steps 720 and 745, the wall scanner 5 also waits for the user to change sensing modes or recalibrate the wall scanner 5 (step 730). Alternatively, the user can activate the menu button 510 from the control section 65 (step 750) to set up wall scanner tools (step 755) such as selecting display units and turning sound on and off. To exit the tools setup, the user activates the menu button 510 a second time (step 760).

Thus, the invention provides, among other things, a wall scanner that includes a stud sensor, a metal sensor, an AC voltage sensor, a liquid crystal display, and an easy-to-grip handle portion that allows a user to manipulate and control the wall scanner using a single hand. The handle portion is operable to receive a high-voltage removable and rechargeable battery pack, such as a battery pack having a lithium-based chemistry. Various features and advantages of the invention are set forth in the following claims.

What is claimed is:

1. A wall scanner for sensing objects behind a surface, the wall scanner comprising:
 a housing that includes a body portion and a handle portion, the handle portion having a first axis and defining a first recess, the body portion having a second axis approximately parallel to the first axis;
 first and second power terminals within the first recess;
 wherein a second recess is formed between the body portion and the handle portion; and
 wherein the first recess is operable to receive a removable battery pack along the first axis, the battery pack being electrically connected to the first and second power terminals and substantially covering the first recess when inserted into the first recess;
 wherein the handle has an outer surface defining a cylinder along the first axis, the battery pack being within the cylinder;
 a first sensor of a first sensor type for sensing a first object of a first object type behind the surface;
 a second sensor of a second sensor type for sensing a second object of a second object type behind the surface;
 wherein the first sensor type is different than the second sensor type, and the first object type is different than the second object type;
 a non-contact voltage sensor operable to detect a medium carrying an alternating current behind the surface; and
 a display configured to display a plurality of indications to a user, the indications including at least an indication of a depth of the second object behind the surface and a graphical representation of the location of the first object behind the surface.

2. The wall scanner of claim 1, wherein the first sensor is a capacitive plate sensor.

3. The wall scanner of claim 1, wherein the second sensor is a D-coil sensor.

4. The wall scanner of claim 1, wherein the first object type is a stud.

5. The wall scanner of claim 1, wherein the second object type is a metal.

6. The wall scanner of claim 1, further comprising a control section including a plurality of actuation devices configured to be actuated by a gripping hand of a user, wherein the handle portion is gripped by the gripping hand of the user.

7. The wall scanner of claim 1, wherein the battery pack is a lithium-ion battery pack.

8. A method of operating a non-motorized wall scanner that includes a handle portion having a first axis and defining a receiving chamber, first and second power terminals positioned in the receiving chamber, a body portion having a second axis approximately parallel to the first axis, a first sensor of a first type, and a second sensor of a second type, the method comprising:
 inserting a removable battery pack into the receiving chamber of the handle portion along the first axis, the battery pack including a battery pack housing, a plurality of battery cells supported by the battery pack housing, and battery pack terminals electrically connected to the plurality of battery cells, when inserted the battery pack is inserted into the receiving chamber, the battery pack substantially covering the receiving chamber, and the battery pack terminals connecting to the first and second power terminals;
 wherein the handle has an outer surface defining a cylinder along the first axis, wherein inserting includes inserting the battery pack into the receiving chamber with the battery pack being within the cylinder;
 holding the handle for single-handed operation of the wall scanner;
 powering the wall scanner with the removable battery pack;
 sensing, using the first sensor, a first object of a first object type behind a surface;
 sensing, using the second sensor, a second object of a second object type behind the surface;
 wherein the first sensor type is different than the second sensor type, and the first object type is different than the second object type;
 detecting, using a non-contact voltage sensor, a medium carrying an alternating current behind the surface; and
 displaying, on a display, a plurality of indications to a user, the indications including at least an indication of a depth of the second object behind the surface and a graphical representation of the location of the first object behind the surface.

9. The method of claim 8, wherein the first sensor is a capacitive plate sensor.

10. The method of claim 8, wherein the second sensor is a D-coil sensor.

11. The method of claim 8, wherein the first object type is a stud.

12. The method of claim 8, wherein the second object type is a metal.

13. The method of claim 8, further comprising controlling the wall scanner using one or more actuation devices configured to be actuated by a gripping hand of a user, wherein the handle portion is gripped by the gripping hand of the user.

14. The method of claim 8, wherein the battery pack is a lithium-ion battery pack.

15. A wall scanner for sensing objects behind a surface, the wall scanner comprising:
 a housing that includes a body portion and a handle portion, the handle portion forming a first axis and defining a first recess, the body portion forming a second axis, the second axis being approximately parallel to and offset from the first axis;
 first and second power terminals within the first recess;
 wherein the first recess is operable to receive a battery pack having a lithium-based chemistry, the battery pack being electrically connected to the first and second power terminals and substantially covering the first recess when inserted into the first recess;
 wherein the handle has an outer surface defining a cylinder along the first axis, the battery pack being within the cylinder;
 a first sensor of a first sensor type for sensing a first object of a first object type behind the surface;
 a second sensor of a second sensor type for sensing a second object of a second object type behind the surface;
 wherein the first sensor type is different than the second sensor type, and the first object type is different than the second object type; and
 a non-contact voltage sensor operable to detect a medium carrying an alternating current behind the surface.

16. The wall scanner of claim 15, wherein the first sensor is a capacitive plate sensor.

17. The wall scanner of claim 15, wherein the second sensor is a D-coil sensor.

18. The wall scanner of claim 15, wherein the first object type is a stud.

19. The wall scanner of claim 15, wherein the second object type is a metal.

20. The wall scanner of claim 15, further comprising a control section including a plurality of actuation devices configured to be actuated by a gripping hand of a user, wherein the handle portion is gripped by the gripping hand of the user.

* * * * *